US010620430B2

(12) United States Patent
Price et al.

(10) Patent No.: US 10,620,430 B2
(45) Date of Patent: Apr. 14, 2020

(54) GEOMETRICALLY MULTIPLEXED RGB LASERS IN A SCANNING MEMS DISPLAY SYSTEM FOR HMDS

(71) Applicant: MICROSOFT TECHNOLOGY LICENSING, LLC, Redmond, WA (US)

(72) Inventors: Raymond Kirk Price, Redmond, WA (US); Joshua Owen Miller, Woodinville, WA (US); Yarn Chee Poon, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/869,492

(22) Filed: Jan. 12, 2018

(65) Prior Publication Data
US 2019/0219815 A1    Jul. 18, 2019

(51) Int. Cl.
*G02B 26/08* (2006.01)
*H04N 13/344* (2018.01)
(Continued)

(52) U.S. Cl.
CPC ....... *G02B 26/0841* (2013.01); *G02B 26/101* (2013.01); *G02B 26/105* (2013.01);
(Continued)

(58) Field of Classification Search
CPC .................................................. H04N 13/344
See application file for complete search history.

(56) References Cited

U.S. PATENT DOCUMENTS 8,274,522 B2 *  9/2012  Brown ............... G02B 26/0816
                                                345/560
9,274,333 B2    3/2016  Hagood et al.
(Continued)

FOREIGN PATENT DOCUMENTS

| DE | 102007034958 A1 | 11/2008 |
| EP | 0687933 A2 | 12/1995 |
| WO | 2016183381 A1 | 11/2016 |

OTHER PUBLICATIONS

"Implementing Laser Scanned—MEMS Projection in Automotive Head—Up Displays", In Proceedings of Intersil, Sep. 17, 2016, pp. 1-8.
(Continued)

*Primary Examiner* — Jefferey F Harold
*Assistant Examiner* — Justin B Sanders
(74) *Attorney, Agent, or Firm* — Workman Nydegger

(57) ABSTRACT

Systems and methods are utilized for performing geometric multiplexing in MEMS display systems that utilize RGB laser diodes and MEMS mirrors to compensate for angular separation between the RGB light that results from passing the RGB light emitted from the RGB laser diodes through a single collimating lens shared by the RGB laser diodes, as opposed to utilizing a separate collimating lens for each corresponding laser diode. Spatial offsets between the RGB light at the target display, resulting from the angular separation, are compensated for by applying temporal buffers to the pulsing of the RGB laser sources so that the RGB light is horizontally and vertically aligned at the appropriate pixels of the target display during scanning by the MEMS mirrors system.

18 Claims, 9 Drawing Sheets

(51) Int. Cl.
*G02B 27/10* (2006.01)
*G02B 26/10* (2006.01)
*G02B 27/01* (2006.01)
*H04N 9/31* (2006.01)

(52) U.S. Cl.
CPC ....... *G02B 27/0172* (2013.01); *G02B 27/102* (2013.01); *G02B 27/104* (2013.01); *H04N 13/344* (2018.05); *B81B 2201/047* (2013.01); *H04N 9/3129* (2013.01)

(56) References Cited

U.S. PATENT DOCUMENTS

| | | | |
|---|---|---|---|
| 9,578,318 B2 | 2/2017 | Fleck et al. | |
| 2003/0011751 A1 | 1/2003 | Sakata et al. | |
| 2005/0168728 A1 | 8/2005 | Stern et al. | |
| 2009/0051828 A1 | 2/2009 | Brown et al. | |
| 2009/0161705 A1 | 6/2009 | Almoric et al. | |
| 2010/0149073 A1* | 6/2010 | Chaum | G02B 27/0093 345/8 |
| 2012/0218525 A1 | 8/2012 | Kwon et al. | |
| 2012/0274909 A1* | 11/2012 | Schulz | G02B 27/104 353/31 |
| 2016/0282625 A1 | 9/2016 | Fleck et al. | |
| 2016/0327906 A1* | 11/2016 | Futterer | G02F 1/133553 |
| 2018/0231715 A1* | 8/2018 | Bishop | G02B 6/3518 |

OTHER PUBLICATIONS

Wu, et al., "Personal Near-to-Eye Light-Field Displays", Retrieved From <<http://informationdisplay.org/IDArchive/2014/NovemberDecember/FrontlineTechnologyNeartoEyeLight.aspx>>, Nov. 2014, 9 pages.

Holmgren, et al., "Scanned Laser Displays for Head Mounted Displays", In Technical Report of University of North Carolina Department of Computer Science, TR92-029, Jul. 1, 1992, 16 Pages.

"International Search Report and Written Opinion Issued in PCT Application No. PCT/US18/066624", dated Mar. 29, 2019, 15 Pages.

* cited by examiner

GEOMETRICALLY MULTIPLEXED RGB LASERS IN A SCANNING MEMS DISPLAY SYSTEM FOR HMDS

BACKGROUND

HMDS (Head Mounted Display Systems) have been found to facilitate a variety of recreational, educational and vocational endeavors. HMDS render holograms and other information within immersive mixed reality environments, such as augmented reality environments and virtual reality environments.

The imaging performed by HMDS occurs in very close proximity to the users' eyes, making it desirable to render the images with a high degree of precision and resolution. However, optical and computational components that are required to render high quality images within such a small form factor are economically and computationally expensive.

MEMS (Micro Electrical Mechanical Systems) mirrors systems represent one technological advance for rendering high quality images more efficiently with HMDS. MEMS mirrors system are configured with one or more modulating mirrors that scan light from a light source, such as an RGB (Red, Green, Blue) laser assembly, and redirect that light to the individual pixels of a target display to thereby generate each frame for the images that are rendered by the HMDS.

RGB laser assemblies used with MEMS mirrors systems typically include separate red, green and blue laser diodes, as well as three correspondingly separate collimating optics. Each of the collimating optics is configured to separately collimate and direct the light from their correspondingly different laser diode to a beam combiner. The beam combiner combines the individually collimated beams of red, green and blue light into a single beam of light that is redirected to the MEMS mirrors system. In this manner, the RGB light is spectrally combined prior to scanning by the MEMS mirrors system.

An example of a typical RGB laser assembly 100 used in combination with a MEMS mirror system 110 is shown in FIG. 1. As shown, the RGB laser assembly 100 includes a red laser diode 110r, a green laser diode 110g and a blue laser diode 110b. The red laser diode 110r generates red light 112r that is collimated by a first collimating optic 120r. The green laser diode 110g generates green light 112g that is collimated by a second collimating optic 120g. And, the blue laser diode 110b generates blue light 112b that is collimated by a third collimating optic 120b.

The collimated beams of red light 112r, green light 112g and blue light 112b are then spectrally combined by the optics of beam combiner 130 and redirected to a MEMS mirror system 140, which performs a scanning process that redirects the light to the individual pixels of a target display. More specifically, a graphics processor or chip, not shown, sequences pulsing of the RGB lasers and modulation of the MEMS mirrors in such a manner that the RGB light beams are redirected to the correct pixels of a target display with the appropriate timing for rendering each pixel of each image frame. For instance, the pulsing of the lasers and the scanning modulation processes are performed iteratively at a very high frequency to accommodate the rendering and refresh rate of the HMDS (e.g., 60 Hz-120 Hz or even faster frame refresh rate).

An existing problem with current MEMS display systems is that many of the costs associated with the laser and optical components are essentially tripled. In particular, the RGB laser assembly 100 has three separate laser diodes, sub-mounts, and packages (110r, 110g and 110b), as well as three correspondingly separate collimating optics (120r, 120g and 120b), each of which adds to the overall cost of the laser assembly. Additionally, the dichroic mirrors used for wavelength combination can be expensive and bulky, increasing the cost and size of the overall assembly. Sometimes, a separate photo-diode component (e.g., photo-diode 150r, 150g and 150b) is also paired with each laser, which further adds to the cost. Utilizing three separate collimators, along with three separate photo diode components (including the wiring for connecting these components), increases the overall size of the RGB laser assembly. However, this is an undesirable attribute for an RGB module, particularly since HMDs require the display systems to be as small as possible, both for aesthetics and functionality.

Yet another problem associated with MEMS display systems is that the scanning of the individual red, green and blue light beams is not always perfectly aligned within the target pixel(s) being scanned, despite the use of the three collimating lenses. For instance, as shown in FIG. 1, MEMS mirror system might scan the pulsed red light 112r, green light 112g and blue light 112b in such a way that the red light 112r, green light 112g and blue light 112b do not perfectly overlap on the target pixel location 190. This can result from various factors, including variability between the laser diodes, misalignment in the disparate collimating optics and inappropriate sequencing of the timing for pulsing the different laser diodes with the modulation of the MEMS mirrors.

Active horizontal and vertical alignment of the light beams within the target pixel location can sometimes resolve this misalignment by calibrating/resequencing the timing of the individual laser diode pulses with the modulation of the MEMS mirrors (e.g., by pulsing the laser diodes more quickly or more slowly). This calibration/alignment process can sometimes be performed to correct for minor misalignments of RGB light, but existing systems limited the correction to less than 10 pixels in the horizontal and vertical directions since the RGB lasers are already co-aligned in existing systems.

Despite the foregoing advances, there is an ongoing need and desire for enabling HMDS to be made more compact, and for the imaging to be performed more precisely and efficiently, as well as for reducing the associated economic costs of the HMDS imaging components.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

Disclosed embodiments include imaging HMDS incorporating RGB laser assemblies and MEMS scanning mirrors and in which a shared collimating optic for the RGB laser light is used, as opposed to different and separate collimating optics for each of the RGB laser diodes.

Disclosed embodiments also include methods for performing geometric multiplexing of RGB light in MEMS display systems that utilize RGB laser diodes and MEMS scanning mirrors. The geometric multiplexing is used to compensate for the angular separation, and corresponding spatial offsets, of the RGB light passing through the shared collimating lens. The geometric multiplexing includes the application of temporal buffers to the pulsing of the RGB laser diodes, which creates spatial adjustments of the RGB light, so that the RGB light is both vertically and horizontally aligned at the appropriate pixels of the target display.

Some embodiments include and/or utilize an additional IR laser, with a wavelength range of 800 to 1000 nm, in the assembly, for IR illumination applications. This additional IR illumination laser is also placed in close geometric proximity to the other visible light laser diodes, such that the RGB and IR lasers are geometrically multiplexed by the same shared collimating lens.

Some embodiments include and/or utilize a MEMS display system that has an RGB laser assembly with a red laser diode that generates red light, a green laser diode that generates green light and a blue laser diode that generates blue light. The MEMS display system also includes a single shared collimating optic positioned between the RGB laser assembly and the MEMS mirrors system. The single collimating optic, or collimating optics group, is positioned to receive, collimate and redirect the RGB light in such a manner that red light, the green light, the blue, and the IR light all pass through the single collimating optic rather than causing the red light, the green light, the blue, and the IR light to pass through disparate collimating optics.

The MEMS display system includes, in some embodiments, the MEMS mirrors system that receives the RGB light from a beam combiner and which obtains the RGB light from the shared collimator. The MEMS mirrors system modulates in sequence with pulsing of the RGB laser diodes to redirect the RGB light to a plurality of individual target pixel locations of the target display.

In some embodiments, the MEMS mirrors system includes a fast scan mirror that modulates light in the horizontal direction relative to the target display and a slow scan mirror that modulates light in the vertical direction relative to the target display. In some embodiments, the slow scan mirror has a slow scan range that extends beyond a top boundary of the target display by a slow scan angle buffer equal to the angular separation between the RGB light emitted from the shared collimator.

In some embodiments, geometric multiplexing of the lasers is performed to compensate for the angular separation and corresponding spatial separation to the RGB light. Some embodiments include, for instance, determining the angular offset that exists between the RGB light in the vertical direction relative to a target display and then applying a timing delay/buffer in pulsing of the RGB laser assembly to compensate for at least a scan lines offset associated with the angular separation of the RGB light in the vertical direction relative to the target display.

In some embodiments, the disclosed methods also include determining the angular offset existing between the RGB light in the horizontal direction and applying a timing delay to pulsing of the RGB laser assembly/diode(s) to compensate for temporal offsets in the RBG light in the horizontal direction relative to the target display and based on the angular separation existing in the horizontal direction relative to the target display.

Other disclosed embodiments for geometric multiplexing of lasers for a MEMS display system include: identifying a quantity of scan lines to be buffered for a slow scan angle buffer of the MEMS mirrors system that is caused by the angular offset of the RGB light, wherein the slow scan angle buffer extends beyond at least one of an upper target display boundary or a lower target display boundary of the target display and setting a scan range for the MEMS mirrors system in a vertical scan direction relative to the target display so as to include the slow scan angle buffer. This is accomplished, in some instances, by timing the pulsing lasers of the RGB laser assembly to temporally offset and compensate for the spatial offset defined by the scan lines to be buffered.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

As previously mentioned, the disclosed embodiments relate to systems and methods for performing geometric multiplexing in MEMS display systems that utilize RGB laser assemblies and MEMS mirrors to compensate for angular separation between the RGB light that results from passing the RGB light emitted from the RGB laser diodes through a shared collimating lens, as opposed to utilizing a different collimating lens for each of the RGB laser diodes with accompanying spectral beam combination.

Spatial offsets that exist between the RGB light incident at the target display, which results from the angular separation of the RGB light passing through a shared collimating lens, are compensated for by applying temporal buffers to the pulsing of the RGB laser sources so that the RGB light is both vertically and horizontally aligned at the appropriate and intended pixel locations of the target display.

The disclosed systems and methods can be used, according to some embodiments, to improve the precision and efficiency for performing imaging by HMDS display systems that utilize MEMS mirrors systems. The disclosed embodiments can also be used to facilitate a reduction in the costs associated with manufacturing and utilizing HMDS display systems by reducing the number of components (e.g., one or more collimators and wavelength beam combiners) utilized during imaging. Disclosed embodiments, for example, require only the use of a single collimator, as opposed to three different collimators like existing systems, and eliminate the wavelength beam combination optics.

Figure 1:
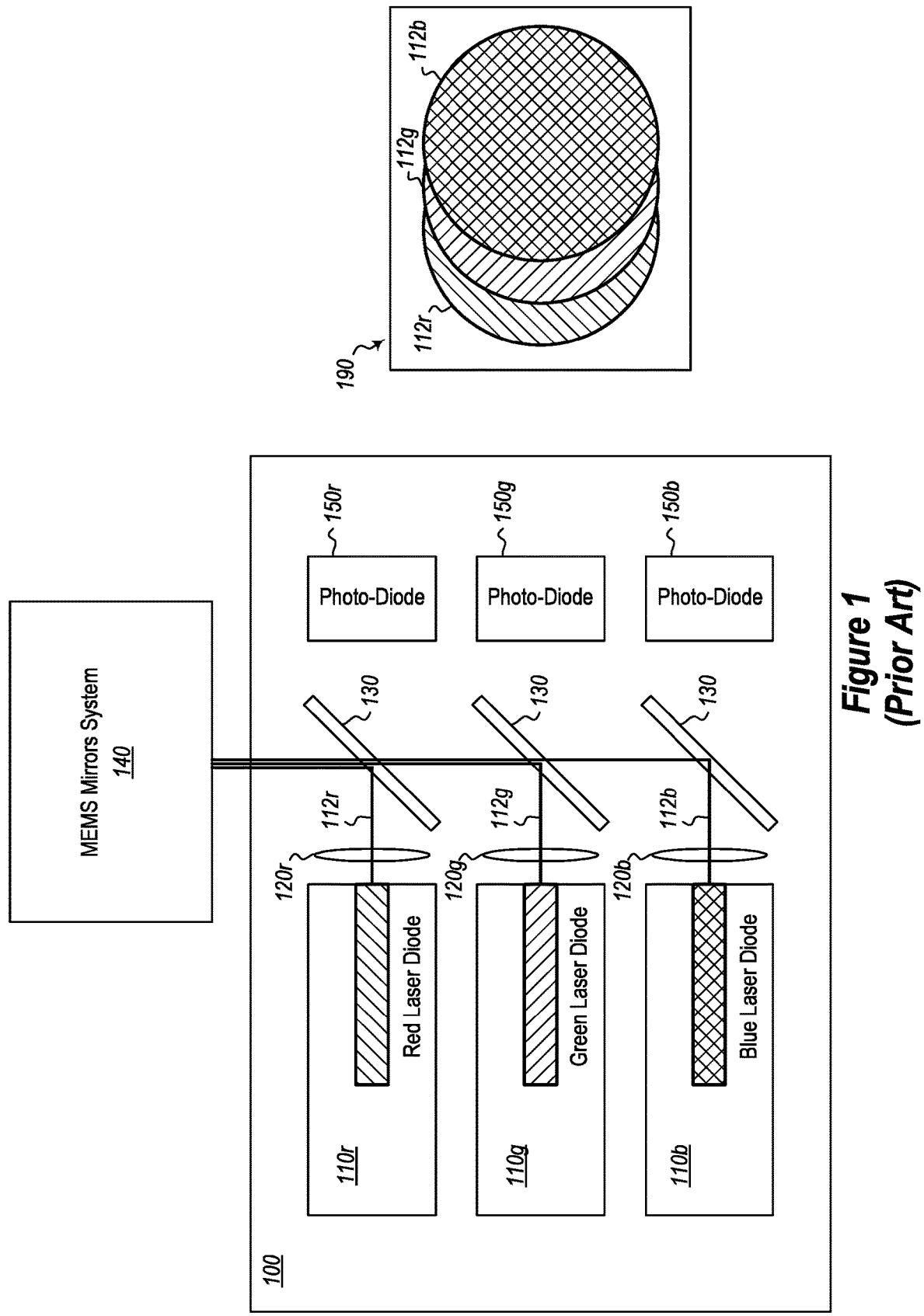
FIG. 1 illustrates a plan view of a typical RGB laser assembly used in existing HMDS with MEMS mirrors systems and which utilizes a separate collimator for each of the RGB laser diodes in the RGB laser assembly.

As previously described in reference to FIG. 1 (above), typical RGB laser assemblies that are used for imaging with MEMS mirrors systems in HMDS utilize a separate collimator for each laser diode. Such a system is illustrated with even greater detail in FIG. 2.

Figure 2:
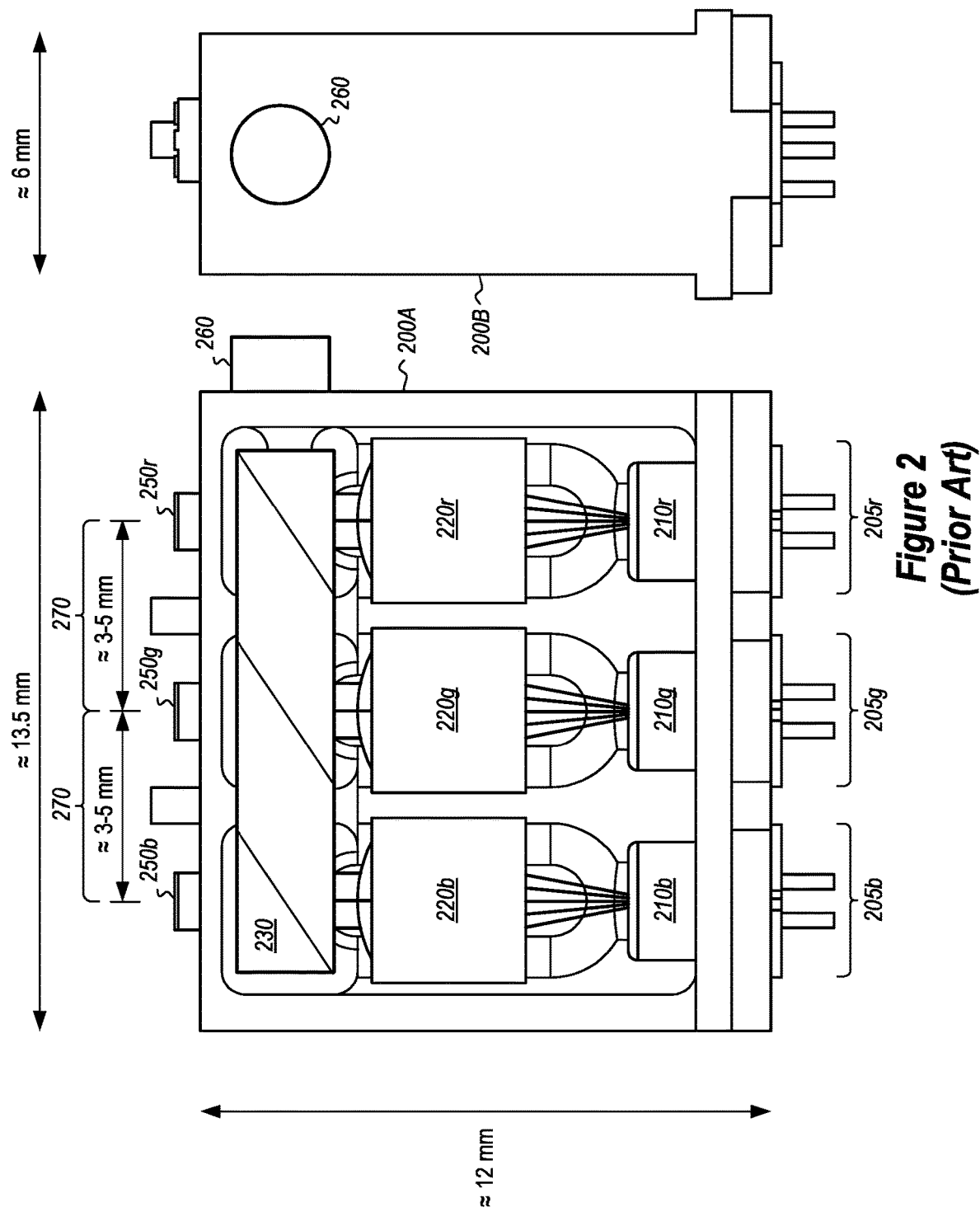
FIG. 2 illustrates a typical RGB laser assembly used in existing HMDS with MEMS mirrors systems and which utilizes a separate collimator for each of the RGB laser diodes in the RGB laser assembly.

As shown in FIG. 2, a typical laser assembly is illustrated in two views, a side cut-away view 200A and a front view 200B. The laser assembly includes three laser diode subassemblies (205r, 205g and 205b), one incorporating to a red laser diode (210r), one incorporating to a green laser diode (210g) and one incorporating a blue laser diode (210b). Notably, each of these laser diodes emits corresponding red, green and blue light, respectively, which passes through a correspondingly different and separate collimator (220r, 220g and 220b). These collimators collimate the light beams and pass the light on to a beam combiner 230. The beam combiner 230 performs spectral beam combination on the light passing through the three separate collimators and emits a resultant RGB light beam out of the laser assembly lens 260.

In some instances, as presently shown, a typical laser assembly will incorporate separate photo-diodes (e.g., 250r, 250g and 250b), one for each of the different lasers, to monitor the signals emitted from the lasers. One reason that a plurality of separate photo-diode components are used is because of the spatial separation existing between the laser diodes (210r, 210g and 210b), which is typically about 3-5 mm (reflected by distance 270), as well as the use of the three different collimators (220r, 220g, 220b).

However, the currently disclosed embodiments are able to dispense with the need and cost of three separate collimators by utilizing a shared collimator and applying geometric multiplexing to compensate for the angular offset (and corresponding spatial offset of the RGB light) that results from using the shared collimator.

In some of the disclosed embodiments, the RGB laser assemblies are configured with a single photo-diode component, such as photo-diode array with three separate photo-diodes 350 (FIG. 3), rather than three discrete photo-diodes that must be separately wired to the laser assembly. This reduction in the need and cost for three photo-diode components is enabled, in part, due to the disclosed RGB laser assemblies using only a single shared collimator, which makes it is possible to position the laser diodes much more closely together and to facilitate the logistics of using only a single photo-diode array. For instance, with reference to FIG. 3, the spacing defined by distance 370 between the laser diodes in the current embodiments is less than distance 270 between laser diodes in existing system of about 3-5 mm. In some instances, the newly utilized distance between the lasers 370 (specifically the emission areas of the lasers) is less than 3 mm. In fact, in some instances, the distance 370 between the lasers 370 is significantly less than 3 mm (e.g., between 200μ and 2 mm). This spacing enables, in some embodiments, for the RGB laser diodes to all be mounted on a single common submount/fixture, whereas existing RGB modules mount each of the RGB laser diodes on their own separate submounts.

In some embodiments, not shown, an additional (fourth) laser diode is positioned next to the RGB laser diodes. This fourth laser diode can be, for instance, an IR laser diode that generates/emits IR light, or any other type of laser diode configured to emit a different or same light spectrum as generated by the red, green and/or blue laser diode(s). The light emitted by the fourth laser diode also passes through the same shared collimator as used for the RGB light.

Figure 3:
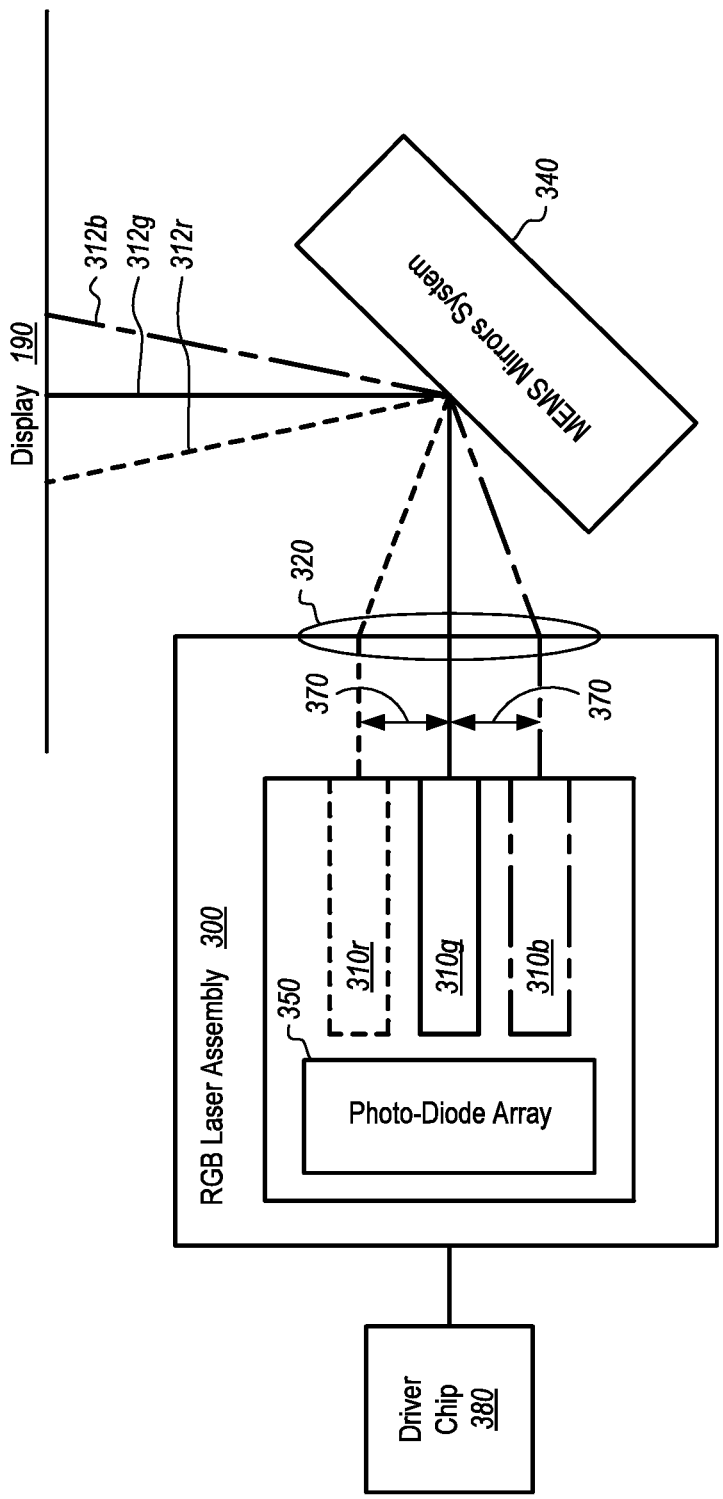
FIG. 3 illustrates components of a HMD (Head Mounted Display) system that includes an RGB laser assembly and a MEMS Mirrors System in which the RGB laser assembly utilizes a common collimating optic for the RGB laser diodes, rather than a separate/different collimating optic for each of the RGB laser diodes.

As generally indicated by the schematic representation of FIG. 3, the individual RGB laser diodes (310r, 310g, 310b) and the photo-diode array 350 of the RGB laser assembly 300 are powered/controlled by hardware and/or software, such as by driver chip 380. Driver chip 380 is currently shown as a single component. However, it will be appreciated that the driver chip 380 is, according to some embodiments, a distributed computer system incorporating at least one memory storing computer-executable instructions for implementing the disclosed acts/methods of the invention and at least one processor that executes the stored computer-executable instructions.

In some instances, the driver chip 380 is a laser and MEMs controller that includes timer modules for timing and sequencing the pulsing/firing of the individual laser diodes to coincide with the modulation of the mirrors during scanning of the MEMS mirrors system 340, as well as for buffering/adjusting the timing/sequencing to compensate for the temporal difference associated with the spatial offset caused by the angular separation between the RGB light resulting from the use of a single collimating lens. By way of example, the driver chip 380 calculates (according to some embodiments) the timing required to buffer/delay a laser diode pulse (firing event) when the light associated with that firing event (which is intended for a particular target pixel location) is temporally/spatially misaligned with the target pixel location (due to corresponding MEMS mirror positioning) and the known angular offset of the light passing out of the collimating lens 320 relative to the other RGB light beams (312r, 312g, 312b) for the target pixel location on the display 190. The driver chip 380 applies this buffering as a temporal scan offset, on a per pixel and per laser diode basis, to compensate for the misalignment in the vertical direction and the horizontal direction so that the RGB light (312r, 312g, 312b) intended for a particular pixel location is aligned with that target pixel location. The driver chip 380 is also configured to identify/calculate a buffer to apply to the scanning angle of the MEMS slow scan mirror in the vertical direction. Each of these processes will be described in more detail below, with reference to FIGS. 5-8.

The driver chip 380 also includes, in some instances, graphics processing modules for generating color maps for rendering the individual pixels of a target display, as well as the controls and drivers for modulating the mirrors and/or sensing the positioning of the mirrors of the MEMS mirrors system during scanning by the MEMS mirrors system of the individual pixels, so as to facilitate sequencing of the laser pulsing with the MEMS mirror modulations to enable scanning of the laser light at the desired target pixel locations.

It will be appreciated that while the collimating optic 320 is currently shown as a single lens, the collimating optic can include more than one lens element, as long as the collimating lens element(s) of the collimating optic are commonly shared between the RGB light, such that RGB light (312r, 312g, 312b) emitted from the separate laser diodes (310r, 310g, 310b) all pass through the same shared lens element(s). Notably, this is very different than existing systems that pass the RGB light beams through separate/ different collimating lens elements that are not commonly shared/utilized by the different RGB light beams. It will also be appreciated that the term collimating optic is sometimes used interchangeably herein with the term collimating lens and collimator.

Finally, it will also be appreciated that the foregoing HMD system components (e.g., RGB laser assembly 300, driver chip 380, MEMS mirrors system 340 and display 190) can be incorporated into a single HMD system (while not specifically shown in FIG. 3), or a distributed system, such that the disclosed embodiments include any improved RGB laser assemblies, as well as any systems like the HMDS that incorporate and/or utilize the improved RGB laser assemblies.

Figure 4:
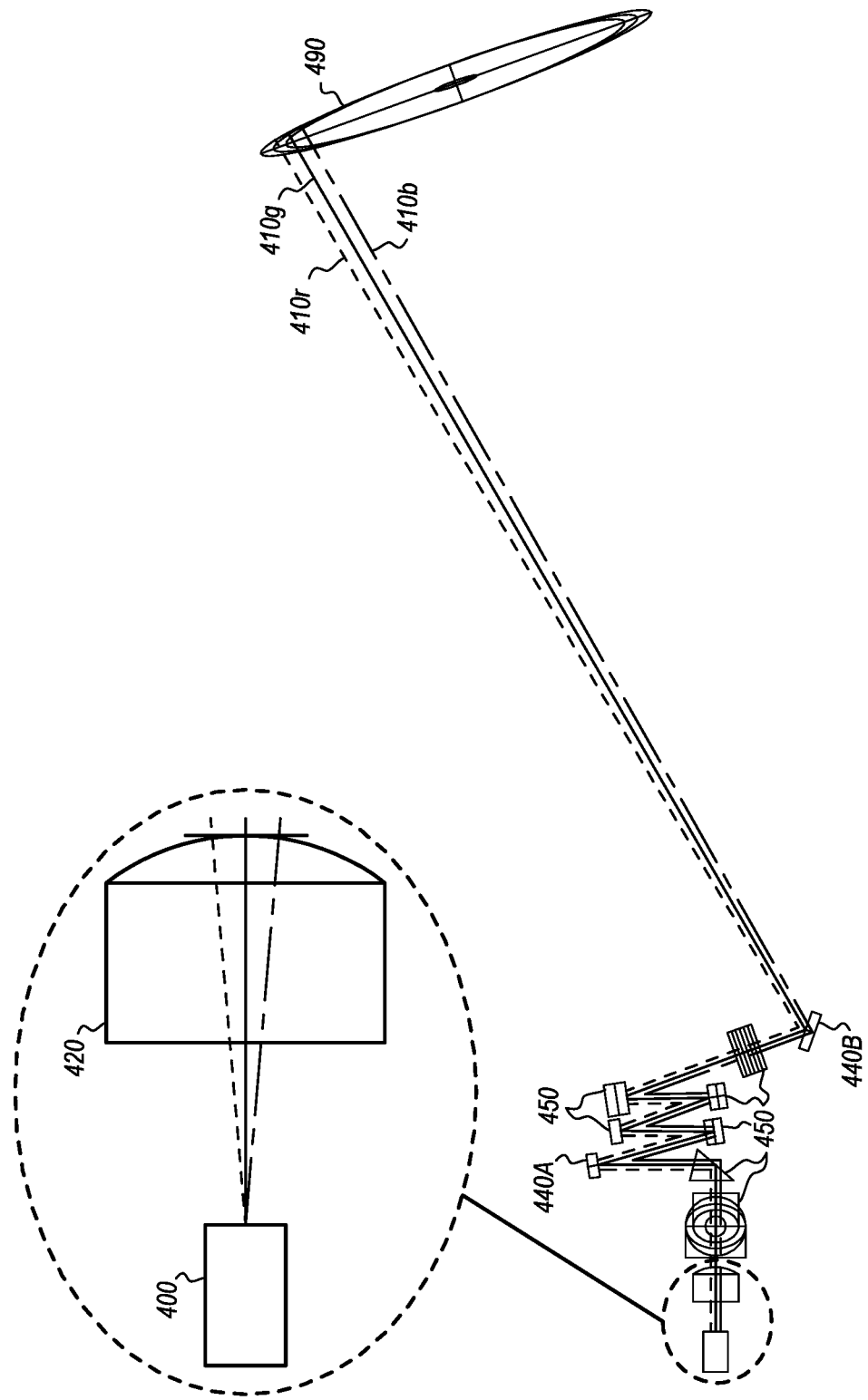
FIG. 4 illustrates components of a HMD (Head Mounted Display) system that includes an RGB laser assembly and a MEMS Mirrors System having a fast scan mirror and a slow scan mirror and in which the RGB laser assembly utilizes a common collimating optic for the RGB laser diodes, rather than a separate/different collimating optic for each of the RGB laser diodes.

Attention will now be directed to FIG. 4, which illustrates another example and perspective of an RBG laser incorporated into a scanning MEMS system and display assembly 400 that utilizes a commonly shared collimator 420 and which results in the RGB light (410r, 410g, 410b) being angularly offset/misaligned at least in a vertical/row direction relative to a target display 490.

As shown in this illustration, the light passing out of the collimator 420 passes through several other optical elements 450, including various relay optics. The current illustration also shows some of the MEMS mirrors system components, including a fast scan mirror 440A and a slow scan mirror 440B. The fast scan mirror is configured to modulate in the horizontal direction, relative to the target display 490, while the slow scan mirror is configured to modulate in the vertical direction, relative to the target display 490.

In some embodiments, the fast scan mirror is a single axis mirror that modulates at a frequency of about 24000 Hz while the slow scan mirror is a single axis mirror that modulates at a slow frequency of about 120 Hz. However, in other embodiments, the fast and slow scan mirrors modulate more quickly or more slowly than the referenced 24000 Hz and 120 Hz, respectively.

It will also be appreciated that is some embodiments, a single modulating mirror, which is a dual axis mirror, is used to articulate/modulate along the horizontal and vertical directions of the target display, rather than utilizing a combination of fast and slow scan mirrors. In such instances that a single dual axis mirror is used, the disclosure presented herein for the slow scan mirror applies to a first axis of modulation for the mirror in the vertical direction relative to the target display while the disclosure presented herein for the fast scan mirror applies to the alternate axis of modulation for the mirror in the horizontal direction relative to the target display.

In yet other embodiments, multiple redundant mirrors are used by the MEMS mirrors system to scan different target pixel locations in the same target display. In these embodiments, the same and/or additional sets of the RGB laser diodes are used to emit light scanned by the MEMS mirror system. For instance, in some embodiments, a first RGB laser diode set is used with a first set of one or more MEMS scanning mirrors that scan at least a first part of a target image with light emitted from the first RGB laser diode set passing through a first collimating lens, while a second set of RGB laser diodes is used with the first and/or a second set of MEMS scanning mirrors for scanning at least another part of the target image utilizing RGB light from the second RGB laser diode set that collectively passes through the first or, alternatively, through a second collimating lens to the scanning mirrors.

Figure 5:
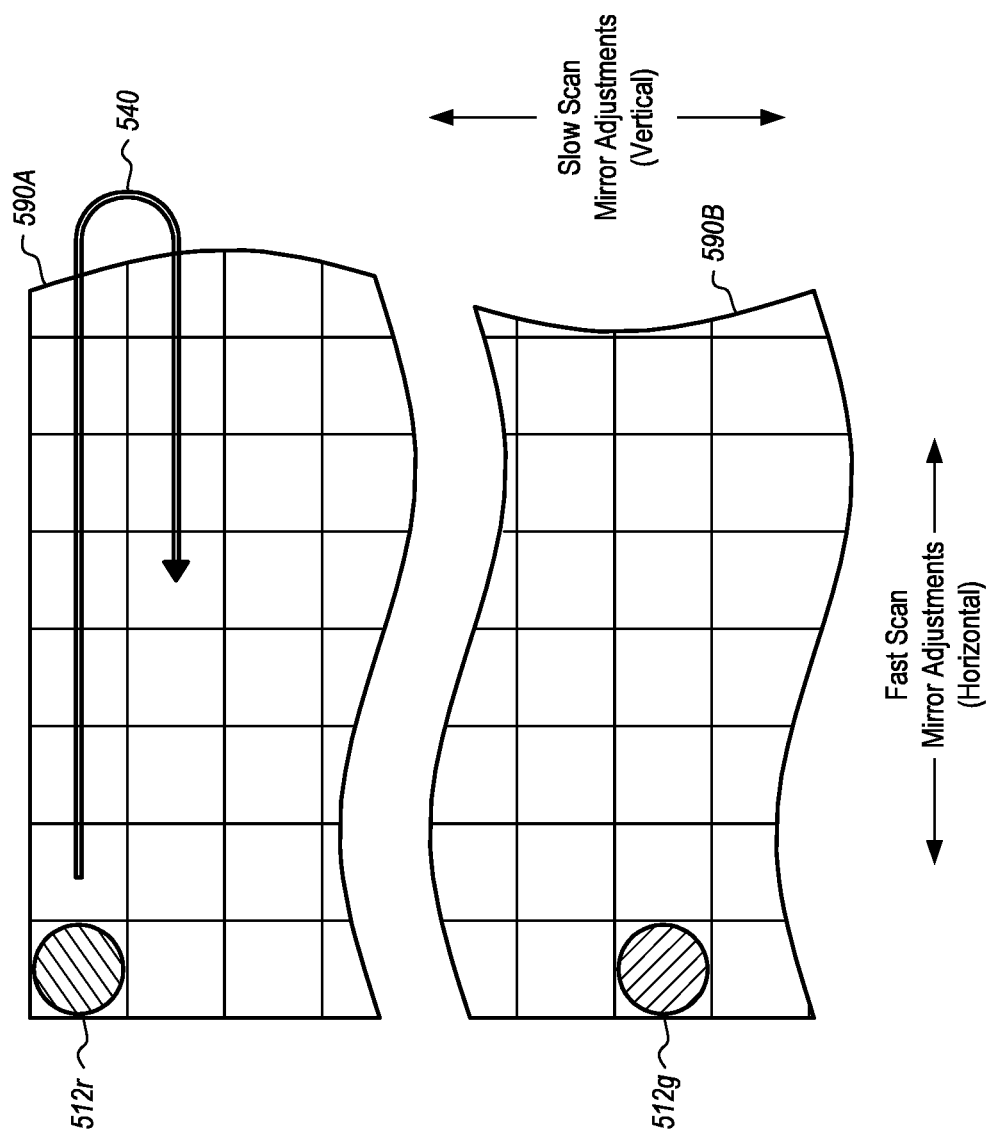
FIG. 5 illustrates an example of a target display with target pixel locations where light is being scanned by a MEMS mirrors system.

Attention will now be directed to FIG. 5 which illustrates an example of a target display having an upper portion 590A and a lower portion 590B and which will be used to provide context for and illustrate some of the principles of the current invention. The number of rows of separation is defined by the angular pointing disparity between each laser diode, as well as the scan rates of the fast and slow scan mirrors. As presently shown, the target display has several pixel locations that are arranged in rows. During scanning by the MEMS mirrors, the slow scan mirror will modulate vertically relative to the target display, row by row, and the fast scan mirror will modulate horizontally relative to the target display, pixel by pixel, such that the light pulsing out of the laser diodes will be scanned/imaged into each of the pixel locations. For instance, by way of example, arrow 540 illustrates a possible path for scanning the R and G light into the pixels of two adjacent rows, which might occur as the slow scan mirror modulates from the first row to the second row and which occurs concurrently with the fast scan mirror modulating a first direction through all of the pixels in the first row and modulating in a second direction through the pixels of the second row. Modulation will continue until all of the pixels are scanned for the frame of the image by all three colors and then the process repeats for each frame rendered during the refresh rate dictated by the display requirements of the HMD system.

In the present illustration, the first pixel location in the target display is scanned with light 512r corresponding to a red laser diode, while light from a green laser diode 512g is vertically offset from light 512r and has been scanned to a much lower row and location within the target display. In this embodiment, the red laser diode light 512r and the green laser diode light 512g originated from a concurrent firing event (simultaneous pulsing) of red and green laser diodes, such that the red light 512r and the green light 512g were intended for the same target pixel location. However, the red light 512r and the green light 512g are spatially offset due to the angular separation that is caused by passing of the green light 512r and the green light 512g through a shared collimator that is positioned relative to the laser diodes having particular spatial separations that result in the scanned red and green light having angular separations that result in the spatial offset that is currently reflected by the positioning of light 512r and 512g.

This offset is compensated for, however, by the currently disclosed embodiments by the exemplary systems identifying the offset and then compensating for this spatial offset by buffering the firing/timing of the different laser diodes so that the light intended for each target pixel location is actually scanned into the appropriate target pixel location.

By way of example, if red light 512r was intended to be rendered with green light 512g in the same location where green light 512g is currently shown, the system will cause red light 512r to be scanned into the correct location by delaying the firing of the red laser diode by the appropriate time delay (typically in the range of 10s to 100s of microseconds) required for the slow scan mirror to modulate to the correct row position where the red light will be scanned into the correct pixel location. In some instances, temporal buffering can also be applied to compensate for any misalignment in the horizontal direction, by delaying the amount of time required for the fast scan mirror to be correctly positioned for scanning the light into the correct location.

The system identifies the correct temporal buffer corresponding to the spatial offset (and which also coincides with the angular separation between the red light 512r and the green light 512g due to sharing the same collimator that is causing the angular separation), by calculating the angular separation and by determining the time delay associated with the angular separation (based on the scanning frequencies of the mirror modulations of the slow and fast scan mirrors).

While some existing systems currently apply temporal buffering for calibrating minor unintentional misalignments of about 10 pixels or less in the horizontal and vertical directions, no existing systems apply temporal buffering to compensate for intentional and significant misalignments of more (particularly in the vertical direction) that is caused by passing all of the RGB light through a single collimating lens, by geometrically multiplexing the pulsing of the laser (s) with the modulations of a slow scan mirror in the vertical direction relative to a target display. The reason for this is that existing systems have already spatially aligned all of the RGB laser light to the same vertical positioning/row(s) with the use of different collimators in combination with the beam combiner.

The significant/intentional vertical misalignments that are created and compensated for according to the present disclosure are greater than 10 pixels. In some instances, the vertical misalignments being corrected are at least 20 pixels. In some instances, the vertical misalignments being corrected are at least 30 pixels. In some instances, the vertical misalignments being corrected are at least 40 pixels. In some instances, the vertical misalignments being corrected are at least 50 pixels. In some instances, the vertical misalignments being corrected are at least 60 pixels. In some instances, the vertical misalignments being corrected are at least 70 pixels. In some instances, the vertical misalignments being corrected are at least 80 pixels. In some instances, the vertical misalignments being corrected are at least 90 pixels. In some instances, the vertical misalignments being corrected are at least 100 pixels. In some instances, the vertical misalignments being corrected are greater than 100 pixels and/or even more than 150 pixels. The present embodiments use a shared collimator that results in angular separation of the RGB light beams and vertically misaligns the RGB light into different rows at the target display. However, this misalignment is compensated for, according to the disclosed embodiments, by geometrically multiplexing the RGB light with the MEMS scanning mirrors' modulations by temporally buffering the pulsing of the appropriate laser diode(s) during the MEMS slow mirror scanning to compensate for the spatial offset of the RGB light in the vertical direction relative to the target display.

One undesired consequence of the angular misalignment caused by using a common collimator, however, is that it is not possible to compensate for all of the spatial offset that may result at/near the upper and lower boundaries of the target display. This will now be explained by describing the example shown in FIG. 5. In this example, the green light 512g was originally intended to be rendered in the top row along with the red light 512r. However, it is not possible to adjust/compensate for the vertical misalignment of green light 512g by simply temporally buffering/delaying the firing of the green laser diode (or any other laser diode, for that matter). In particular, any temporal buffering of the green laser diode will simply increase the spatial offset and misalignment between the green light 512g and the red light 512r in the desired target pixel location. Additionally, spatial buffering of the red laser diode in the vertical direction would simply reposition the red light 512r closer to the position of the green light 512g. But, this would mean that neither the red light 512r nor the green light 512g are scanned to the desired/correct pixel location. Similar problems can also occur at the bottom boundary of the target location.

Figure 6A:
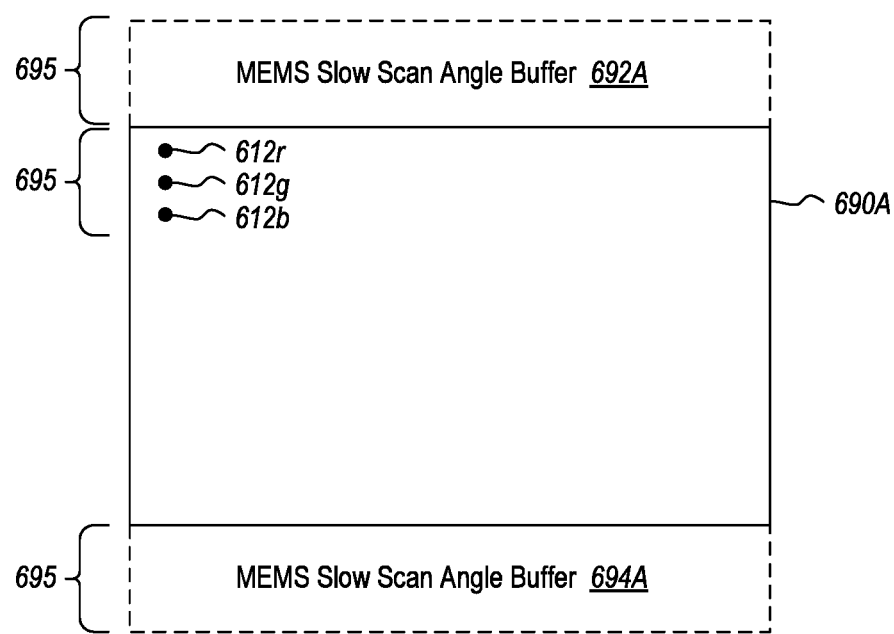
FIG. 6A illustrates an example of a target display with a slow scan angle buffer region above an upper boundary of the target display and a similar slow scan angle buffer region below a lower boundary of the target display, corresponding to an angular offset of RGB light resulting from the use of a single/common collimating lens for the RGB light emitted from an RGB laser assembly of a HMD.
Figure 6B:
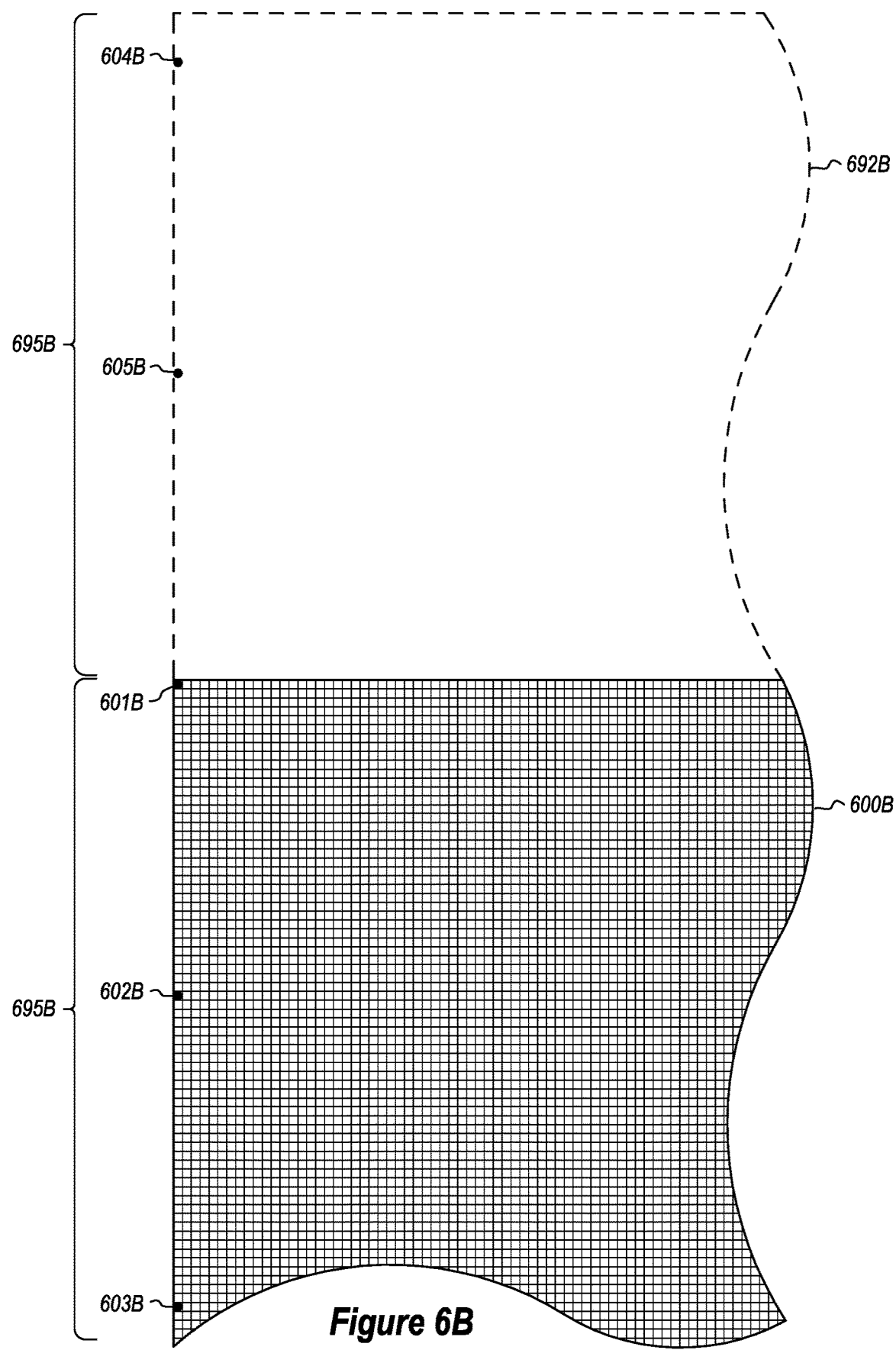
FIG. 6B illustrates another example of a target display with a slow scan angle buffer region above an upper boundary of the target display, corresponding to an angular offset of RGB light resulting from the use of a single/common collimating lens for the RGB light emitted from an RGB laser assembly of a HMD.

To accommodate for the foregoing problems, the current embodiments identify and apply a vertical scanning buffer region (also referred to herein as a vertical overscan region) to the target display, as shown and described in reference to FIGS. 6A and 6B.

In some embodiments, the vertical scanning buffer region extends beyond the upper boundary (e.g., above the upper boundary) and beyond the lower boundary (e.g., below the lower boundary) of the target display. For instance, as shown in FIG. 6A, the vertical scanning buffer is identified as MEMS slow scan angle buffer 692A, which extends above the top boundary of the target display 690A, and as MEMS slow scan angle buffer 694A, which extends below the bottom boundary of the target display 690B. Each of the buffer regions (e.g., 692A and 294A) correspond with and are equal to at least the spatial offset distance 695 caused by the angular separation of the collimator and the correspondingly resultant spatial separation applied to the incident RGB light beams at the target display, as reflected by RGB light locations 612r, 612g and 612b.

Accordingly, in some embodiments, the slow scan range of the MEMS mirrors system is increased/set to be at least equal to the sum of the vertical scan range of the target display in addition to the vertical scanning buffer region, wherein the vertical scanning buffer region is equal to at least the angular separation caused by the collimator (e.g., the RGB light passing out of the collimator from the RGB laser diodes). In some embodiments, this angular separation equates to 52 pixel rows per angular degree of separation.

For instance, by way of example, if the collimator causes a 4° angular separation (which is a function of both the focal length of the collimator and the spatial separation of the laser—e.g., a focal length of 5 mm and a laser separation of 350µ), and the field of view of the display in the vertical direction is 24.5 degrees with 1280 pixels of resolution, the total vertical scan angle becomes 24.5+4+4=32.5 degrees. Additionally, the vertical scanning buffer region/overscan region will cover at least scan rows above the top boundary of the top boundary of the target display and at least 200 scan rows below the bottom boundary of the target display.

In other embodiments, the vertical scan buffer region/overscan region of each or both buffer regions is in a range of between 50 pixels and 500 pixels (e.g., at least 50 pixels, at least 1000 pixels, at least 150 pixels, at least 200 pixels, at least 250 pixels, at least 300 pixels, at least 350 pixels, at least 400 pixels, at least 450 pixels or another quantity of pixels between 50 and 500 pixels).

FIG. 6B illustrates a target display having an original target display region 600B, which includes the pixel locations that are scanned and rendered during imaging, as well as a vertical scan buffer region 692B which is included in the vertical scanning range, but which is not actually scanned or rendered during imaging. Instead, this buffer region enables temporal buffering to accommodate for the angular separation of the RGB light and the spatial realignment that is needed. For instance, by setting/modifying the range of the vertical scanning angle include the vertical buffer region 692B it is possible to fire/pulse the laser diodes in a sequence (with appropriate temporal buffering) to enable all of the RGB light to be scanned to a desired pixel location (e.g., location 601B) even though there is an angular separation in the RGB light corresponding to the spatial offset defined by distance 695B. For instance, by way of example, if the simultaneous firing/pulsing of the RGB lasers directed to location 601B would result in the red light being directed to location 601B, while the blue light intended for the same pixel is directed to location 602B and the green light intended for the same pixel is directed to location 603B, it is possible to cause all of the RGB light intended for pixel location 601B to be scanned to that pixel location by increasing the vertical scan angle of the slow scan mirror to include the vertical scan buffer region 692B and then applying the correct temporal buffering to the appropriate laser diodes. For instance, the system will simply sequence the firing/pulsing of the RGB lasers to correspond with the slow scan mirror scanning of the pixel location 604B in the buffer region when intending to fire/direct the RGB light to location 601B.

The system will also identify the offset associated with the RGB angular separation and apply the correct temporal buffering to that angular separation to compensate for the corresponding spatial offset, as based on the scanning performed by the slow scan mirror, such that firing of the red laser diode (which would initially cause the scanning of the red light into location 604B) will now be delayed until the slow scan mirror modulates several rows to the appropriate row where the firing of the red laser diode will result in the intended light being scanned into location 601B. Similarly, firing of the green laser diode (which would initially cause the scanning of the green light into location 604B) will now be delayed until the slow scan mirror modulates several rows to the appropriate row where the firing of the green laser diode will result in the intended light being scanned into location 601B. The firing of the blue laser diode, however, will not be delayed, such that it will be scanned at the intended time and intended row/location 601B and which will result in the blue light being scanned to the 601B position, even though the MEMS slow scanning mirror is positioned for scanning at least some of the RGB light into the buffer region that extends beyond the target display.

While the foregoing example has been provided with respect to the upper vertical region of the target display, it will be appreciated that similar temporal buffering is also applied at the lower region of the target display to accommodate for the slow scan/vertical row offset caused by the angular separation of the RGB light. It will also be appreciated that temporal buffering can also be applied to adjust for any minor horizontal misalignment within a single pixel location or between different pixels in a same row of the target display, by applying small delays to the firing/pulsing of the laser diodes sequenced with the fast scan mirror.

Figure 7:
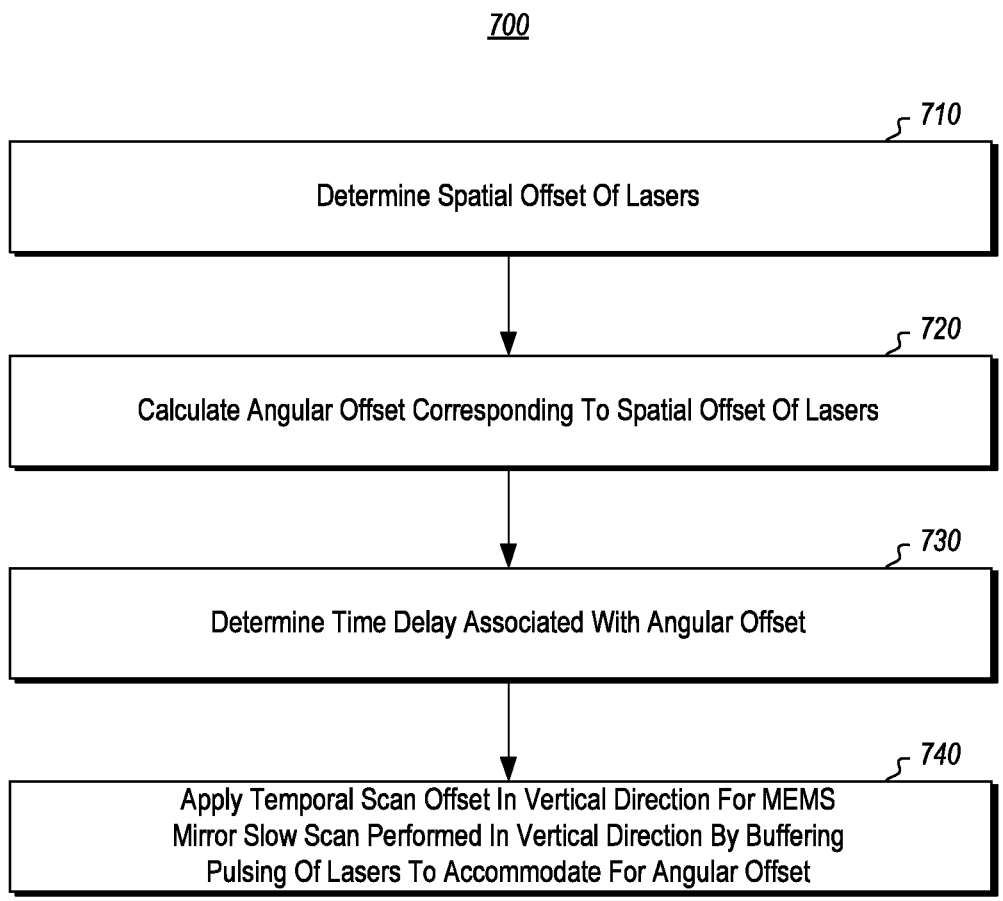
FIG. 7 illustrates a flow diagram of acts associated with embodiments for geometrically multiplexing RGB light for a HMD that incorporates a laser diode assembly that emits the RGB light through a common/single collimating lens and a MEMS mirrors system that scans the light to a target display.

Attention will now be directed to FIG. 7, which illustrates a flow diagram 700 of various acts that are associated with embodiments for geometrically multiplexing RGB light for HMDS that incorporate laser diode assemblies that emit RGB light through a common/single collimating lens and a MEMS mirrors system that scans the light to a target display.

The first illustrated act includes the act of determining the spatial offset of the lasers (act 710). This offset is the offset/distance between the emission areas of the lasers. For instance, as describe in reference to FIG. 3, the spatial offset of the lasers is preferably within the range of about 200µ and 3 mm.

Next, the angular offset corresponding to the spatial offset of the lasers is calculated (act 720). This calculation includes determining the focal length (e.g., 2 mm-10 mm) of a common collimator that the RGB light of the lasers will pass through and dividing the spatial offset by the focal length. Next, the time delay associated with the angular offset is determined (act 730). This is accomplished by calculating a quantity of scan rows (X) the MEMS mirrors system will scan in the vertical direction (e.g., with the slow scan mirror) due to the angular offset and which equates to about 52 rows per angular degree and then multiplying that quantity of scan rows (X) by the modulation frequency of the slow scan mirror. As previously mentioned, the slow scan mirror can modulate at a frequency of 60 Hz or more than 60 Hz or less than 60 Hz. Finally, the temporal scan offset for compensating for the angular offset is applied to the corresponding/appropriate laser in the vertical direction associated with the slow scan of the MEMS mirrors system, to thereby delay (if appropriate) the firing/pulsing of the laser diode and to correct for any spatial misalignment due to the angular separation of the relevant RGB light. (act 740).

It will be appreciated that the foregoing acts are applied on a pixel by pixel basis, for each RGB color/laser diode, to ensure that all of the appropriate colors are scanned to the appropriated target pixel locations for each frame. The process also iterates for each frame and the frame refresh rate of the corresponding HMD display requirements.

Figure 8:
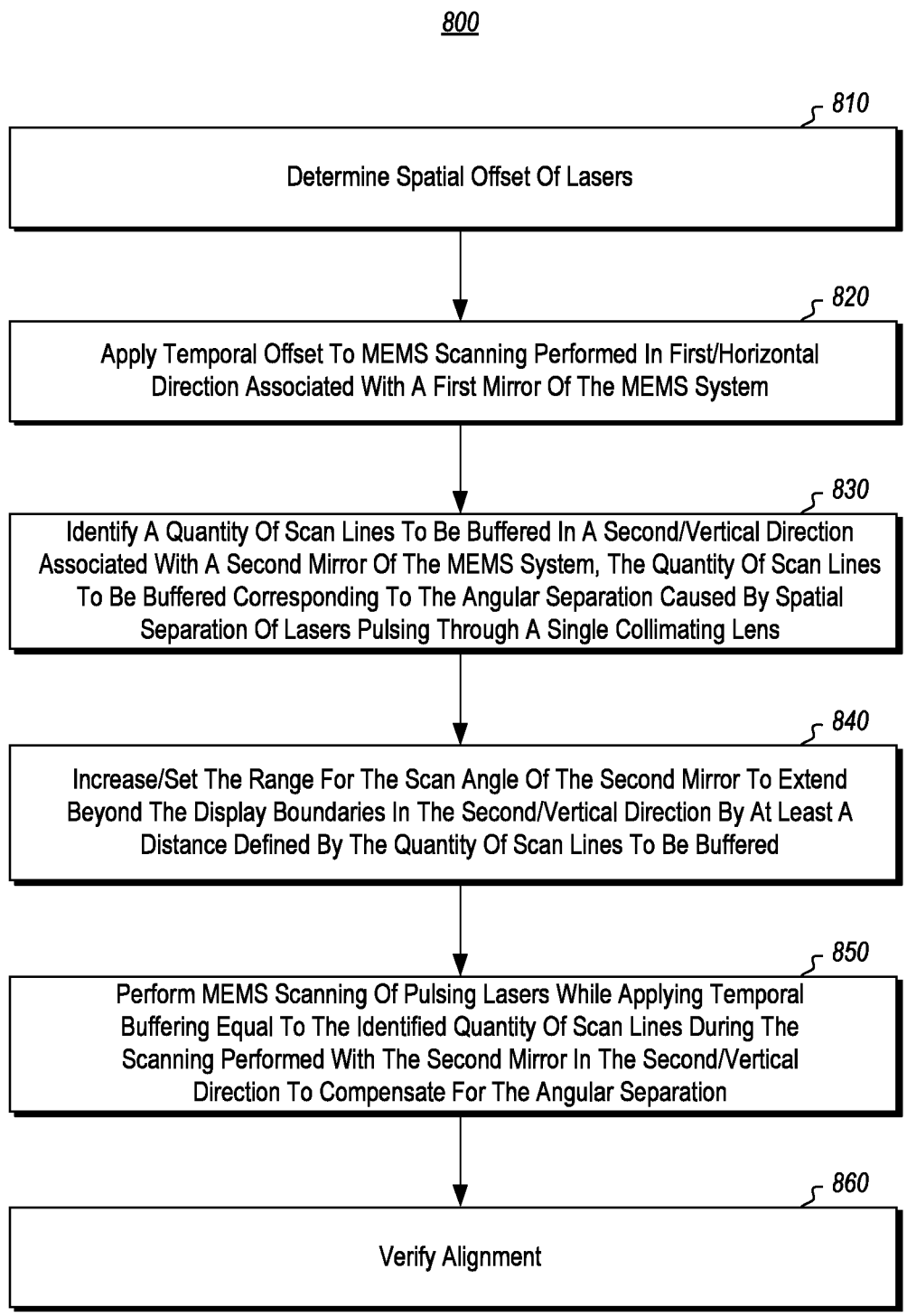
FIG. 8 illustrates another flow diagram of acts associated with embodiments for geometrically multiplexing RGB light for a HMD that incorporates a laser diode assembly that emits the RGB light through a common/single collimating lens and a MEMS mirrors system that scans the light to a target display.

Embodiments of related methods are illustrated by the acts shown in the flow diagram 800 of FIG. 8. As illustrated, the first act is to identify the spatial offset of the lasers (act 810). In some instances, a temporal offset is applied to the MEMS scanning performed in the horizontal direction associated with a first or fast scan mirror of the MEMS mirrors system (act 820). This offset and temporary buffering is applied, when appropriate, to compensate for any horizontal misalignment within a single row of the target display. The disclosed acts also include an act of identifying a quantity of scan lines and/or angular distance to be buffered in a second and vertical direction (act 830), which (according to some embodiments) is associated with a second and slow scan mirror of the MEMS system. In other embodiments, the second direction is simply associated with a second direction of the same mirror used to scan in the first direction.

Next the range for the scan angle of the second direction and/or mirror is set/increased to include at least the distance and corresponding scan lines to be buffered (act 840). In some embodiments, the slow scan mirror is set to include the scan range of the target display plus slow scan buffer range that extends beyond a top boundary of the target display and that is equal to a vertical scan range between at least 1° and (e.g., at least 1°, at least 2°, at least 4°, etc.) and which is equal to a corresponding angular separation defined by light passing through a common collimator receiving light from a centrally positioned laser diode (red, green or blue laser diode) and one of the two other outer laser diodes in the RGB laser assembly.

Next, the MEMS scanning is performed in sequence with the firing/pulsing of the lasers while also applying the temporal buffering corresponding to the identified spatial buffering to be applied (i.e., the angular distance or quantity of scan lines to be buffered). (Act 850)

Finally, the illustrated acts also include verifying alignment. (Act 860). This act may be performed iteratively by examining the actual resultant scanning location of a light element on a target display relative to the intended scanning location for that light element. If the light is on the wrong row, then temporal buffering is increased or decreased relative to the slow scan mirror to adjust the vertical alignment. If the light is on the wrong horizontal position within a particular row then the temporal buffering is increased or decreased relative to the fast scan mirror to adjust the horizontal alignment. Because there are several pixels per row, this means that the temporal buffer required to adjust for a single pixel movement in the vertical direction will be greater than the temporal adjustment to adjust for a single pixel movement in the horizontal direction. The temporal adjustments made to the vertical and horizontal directions can be any appropriate temporal adjustment (e.g., a few pico seconds to a few milliseconds).

While the foregoing acts have been shown to occur with particular ordering, it will be appreciated that the scope of the claims includes methods that are performed with different ordering and that include more or less acts than presently shown. It will also be appreciated that each of the illustrated acts of FIGS. 7-8, as well as the other acts described in this paper, can be performed with the various computing systems described and referenced herein by executing stored-computer executable instructions stored by and/or accessed by the computing systems. For instance, in some embodiments, the disclosed methods may be practiced by a computer system, such as HMD system or a HMD chip, including one or more processors and computer-readable media such as computer memory. In particular, the computer memory may store computer-executable instructions that when executed by one or more processors cause various functions to be performed, such as the acts recited in the embodiments.

Embodiments of the present invention may comprise or utilize a special purpose or general-purpose computer including computer hardware, as discussed in greater detail below. Embodiments within the scope of the present invention also include physical and other computer-readable media for carrying or storing computer-executable instructions and/or data structures. Such computer-readable media can be any available media that can be accessed by a general purpose or special purpose computer system. Computer-readable media that store computer-executable instructions are physical storage media. Computer-readable media that carry computer-executable instructions are transmission media. Thus, by way of example, and not limitation, embodiments of the invention can comprise at least two distinctly different kinds of computer-readable media: physical computer-readable storage media and transmission computer-readable media.

Physical computer-readable storage media includes RAM, ROM, EEPROM, CD-ROM or other optical disk storage (such as CDs, DVDs, etc), magnetic disk storage or other magnetic storage devices, or any other medium which can be used to store desired program code means in the form of computer-executable instructions or data structures and which can be accessed by a general purpose or special purpose computer.

Computer-executable instructions comprise, for example, instructions and data which cause a general purpose computer, special purpose computer, or special purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, and the like. The invention may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Alternatively, or in addition, the functionality described herein can be performed, at least in part, by one or more hardware logic components. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A MEMS (Micro Electrical Mechanical Systems) display system comprising:
    an RGB (red, green, blue) laser assembly comprising a red laser diode that generates red light, a green laser diode that generates green light, and a blue laser diode that generates blue light, wherein a spacing between emission areas of selected pairs of the red laser diode, the green laser diode, and the blue laser diode is required to be about 3 millimeters (mm) or less;

a shared collimating optic positioned between the RGB laser assembly and a MEMS mirror system, the shared collimating optic being positioned to receive, collimate, and redirect the red light, the green light, and the blue light and in such a manner that the red light, the green light, and the blue light all pass through the shared collimating optic rather than passing through separate and different collimating optics;

a MEMS mirrors system that receives the red light, the green light, and the blue light after passing through and being collimated by the shared collimating optic;

a laser and MEMS controller that modulates in sequence with pulsing performed by the red laser diode, the green laser diode, and the blue laser diode of the RGB laser assembly to scan the red light, the green light, and the blue light to a plurality of individual target pixel locations of a target display; and the target display, wherein the shared collimating optic has a particular focal length and a particular positioning relative to the RGB laser assembly, the particular focal length and the particular positioning causing an angular separation to occur between concurrently fired red light, concurrently fired green light, and concurrently fired blue light such that the concurrently fired red light, the concurrently fired green light, and the concurrently fired blue light are vertically misaligned across different rows at the target display by at least 10 pixel rows as a result of passing through the shared collimating optic.

2. The MEMS display system of claim 1, wherein, as a result of the spacing being about 3 mm or less, the red laser diode, the green laser diode, and the blue laser diode are all mounted on a single common sub-mount.

3. The MEMS display system of claim 1, wherein each of the red laser diode, the green laser diode, and the blue laser diode has a width of less than 2 mm.

4. The MEMS display system of claim 1, wherein the particular focal length of the shared collimating optic is between 2 mm and 10 mm.

5. The MEMS display system of claim 1, wherein the particular focal length of the shared collimating optic is greater than 5 mm.

6. The MEMS display system of claim 1, wherein the particular focal length of the shared collimating optic is less than 5 mm.

7. The MEMS display system of claim 1, wherein:
one of the red laser diode, the green laser diode, or the blue laser diode is a centrally positioned laser diode relative to two alternate and outer positioned laser diodes, and
the angular separation between the concurrently fired red light, the concurrently fired green light, and the concurrently fired blue light upon striking the target display is at least 2 degrees.

8. The MEMS display system of claim 7, wherein the angular separation is at least 4 degrees.

9. The MEMS display system of claim 1, wherein the MEMS mirrors system includes a fast scan mirror that modulates light in a horizontal direction relative to the target display and a slow scan mirror that modulates light in a vertical direction relative to the target display.

10. The MEMS display system of claim 1, wherein a slow scan mirror has a slow scan range that extends beyond a top boundary of the target display by more than 10 pixels and below a bottom boundary of the target display by more than 10 pixels.

11. The MEMS display system of claim 10, wherein the slow scan mirror has a slow scan range that extends beyond the top boundary of the target display by more than 100 pixels and below the bottom boundary of the target display by more than 100 pixels.

12. The MEMS display system of claim 1, wherein a slow scan mirror has a slow scan range that extends at least 2 degrees beyond at least one of a top boundary of the target display and a bottom boundary of the target display.

13. A method for performing geometric multiplexing of lasers for a MEMS (Micro Electrical Mechanical Systems) display system, comprising:
determining an angular offset existing between RGB (red, green, blue) light of corresponding RGB lasers of an RGB laser assembly in a vertical direction relative to a target display, which angular offset is caused by passing the RGB light through a shared collimating optic that is shared by all of the RGB lasers, while refraining from passing each of the red light, the green light, and the blue light of the RGB light through separate collimating optics; and
applying a timing delay to at least one of the RGB lasers in pulsing of the RGB laser assembly to compensate for a scan lines offset associated with the angular offset of the RGB light in the vertical direction relative to the target display,
wherein the angular offset is at least partially defined by attributes of the shared collimating optic that is positioned between a MEMS mirrors system and each of a red laser diode, a green laser diode, and a blue laser diode of the RGB laser assembly and in such a manner that the shared collimating optic receives the RGB light generated by and emitted by each of the red laser diode, the green laser diode, and the blue laser diode prior to being scanned by the MEMS mirrors system, and
wherein the shared collimating optic has a particular focal length and a particular positioning relative to the RGB laser assembly, the particular focal length and the particular positioning causing an angular separation to occur between concurrently fired red light, concurrently fired green light, and concurrently fired blue light such that the concurrently fired red light, the concurrently fired green light, and the concurrently fired blue light are vertically misaligned across different rows at the target display by at least 10 pixel rows as a result of passing through the shared collimating optic.

14. The method of claim 13, wherein applying the timing delay additionally compensates for temporal offsets in the RBG light in a horizontal direction relative to the target display based on a particular angular separation existing in the horizontal direction relative to the target display.

15. The method of claim 14, wherein the method further includes verifying horizontal alignment and vertical alignment of the RGB light as scanned by the MEMS mirrors system to the target display in the horizontal direction and the vertical direction.

16. A method for performing geometric multiplexing of lasers for a MEMS (Micro Electrical Mechanical Systems) display system that utilizes a RGB (red, green, blue) laser assembly to generate corresponding RGB light and a MEMS mirrors system for rendering images on a target display having a vertical scan range defined by an upper target display boundary and a lower target display boundary, comprising:

identifying a quantity of scan lines to be buffered for a slow scan angle buffer of the MEMS mirrors system associated with an angular offset of the RGB light, the slow scan angle buffer extending beyond at least one of the upper target display boundary or the lower target display boundary; and setting a scan range for the MEMS mirrors system in a vertical scan direction relative to the target display to include the slow scan angle buffer, wherein a spacing between emission areas of selected pairs of a red laser diode, a green laser diode, and a blue laser diode is required to be about 3 millimeters (mm) or less, the red laser diode, the green laser diode, and the blue laser diode being included in the RGB laser assembly and being used to generate the RGB light, and wherein the scan lines are to be buffered as a result of an angular separation occurring between concurrently fired red light, concurrently fired green light, and concurrently fired blue light passing through a shared collimating optic, and wherein the shared collimating optic has a particular focal length and a particular positioning relative to the RGB laser assembly, the particular focal length and the particular positioning causing the angular separation to occur between the concurrently fired red light, the concurrently fired green light, and the concurrently fired blue light such that the concurrently fired red light, the concurrently fired green light, and the concurrently fired blue light are vertically misaligned across different rows at the target display by at least 10 pixel rows as a result of passing through the shared collimating optic to thereby necessitate buffering the quantity of scan lines.

17. The method of claim 16, wherein the setting is performed for a slow scan mirror of the MEMS mirrors system that modulates in the vertical scan direction and wherein the MEMS mirrors system also includes a fast scan mirror that modulates in a horizontal direction relative to the target display.

18. The method of claim 16, wherein the method further includes timing a pulsing of the red laser diode, the green laser diode, and the blue laser diode of the RGB laser assembly to temporally offset and compensate for a spatial offset defined by the scan lines to be buffered.

* * * * *